(12) United States Patent
Misawa et al.

(10) Patent No.: US 12,273,991 B2
(45) Date of Patent: Apr. 8, 2025

(54) OPTICAL MODULE ASSEMBLY, OPTICAL MODULE, PACKAGE FOR OPTICAL MODULE AND FLEXIBLE PRINTED BOARD

(71) Applicant: SUMITOMO ELECTRIC INDUSTRIES, LTD., Osaka (JP)

(72) Inventors: Taichi Misawa, Osaka (JP); Keiji Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 230 days.

(21) Appl. No.: 18/318,512

(22) Filed: May 16, 2023

(65) Prior Publication Data

US 2023/0380057 A1    Nov. 23, 2023

(30) Foreign Application Priority Data

May 19, 2022   (JP) ................. 2022-082045

(51) Int. Cl.
*H05K 1/02* (2006.01)
*H05K 1/11* (2006.01)
(Continued)

(52) U.S. Cl.
CPC .......... *H05K 1/0274* (2013.01); *H05K 3/103* (2013.01); *H05K 3/1258* (2013.01);
(Continued)

(58) Field of Classification Search
CPC ...... H05K 1/02; H05K 1/0218; H05K 1/0274; H05K 1/0284; H05K 1/0293; H05K 1/11; H05K 1/18; H05K 1/117; H05K 1/118; H05K 1/181; H05K 3/0011; H05K 3/10; H05K 3/103; H05K 3/222; H05K 3/1258; H05K 3/3436; H05K 3/4015; H05K 3/4644; H05K 7/1084; H05K 2201/09981; H05K 2201/10045; H05K 2201/10121
(Continued)

(56) References Cited

U.S. PATENT DOCUMENTS 7,352,601 B1 *   4/2008   Minneman ........... H05K 5/0278
                                                 439/620.01
2017/0303395 A1 * 10/2017  Ishida ...................... H05K 3/22
(Continued)

FOREIGN PATENT DOCUMENTS

JP    2010-192767    9/2010
JP    2015-015513    1/2015

*Primary Examiner* — Xiaoliang Chen
(74) *Attorney, Agent, or Firm* — IPUSA, PLLC

(57) ABSTRACT

A package for an optical module includes a substrate provided through a side wall in a first direction. The substrate includes a first wiring layer including a first signal terminal, a second signal terminal, and a first ground terminal. The package includes a second wiring layer disposed under the first wiring layer. The second wiring layer includes a first ground pattern and a first insulating layer disposed between the first wiring layer and the second wiring layer, and includes a groove extending along the first direction, the groove being filled with a metal. The groove is provided within the first ground terminal, in a plan view, and the first insulating layer is free of the groove. The first ground terminal is electrically coupled to the first ground pattern through the metal of the groove.

6 Claims, 11 Drawing Sheets

(51) Int. Cl.
*H05K 1/18* (2006.01)
*H05K 3/10* (2006.01)
*H05K 3/12* (2006.01)

(52) U.S. Cl.
CPC .............. *H05K 2201/09981* (2013.01); *H05K 2201/10045* (2013.01); *H05K 2201/10121* (2013.01)

(58) Field of Classification Search
USPC .................. 361/748; 365/51, 63; 347/86; 439/620.01, 638, 66
See application file for complete search history.

(56) References Cited

U.S. PATENT DOCUMENTS

| | | | |
|---|---|---|---|
| 2018/0316102 A1* | 11/2018 | Ju ..................... | H01R 13/6581 |
| 2020/0343674 A1* | 10/2020 | Nogawa ............... | H01R 13/502 |
| 2020/0365960 A1* | 11/2020 | Kim ..................... | H01R 12/714 |
| 2023/0271424 A1* | 8/2023 | Luo ........................ | B41J 2/1753 |
| | | | 347/86 |
| 2024/0113477 A1* | 4/2024 | Shinyama ........... | H01R 13/6594 |

* cited by examiner

OPTICAL MODULE ASSEMBLY, OPTICAL MODULE, PACKAGE FOR OPTICAL MODULE AND FLEXIBLE PRINTED BOARD

CROSS-REFERENCE TO RELATED APPLICATION

This application claims priority under 35 U.S.C. § 119 to Japanese Patent Application No. 2022-082045, filed May 19, 2022, the contents of which are incorporated herein by reference in their entirety.

TECHNICAL FIELD

The present disclosure relates to a package for optical module, an optical module, a flexible printed board, and an optical module assembly.

BACKGROUND

Japanese Unexamined Patent Application Publication No. 2015-015513 discloses a flexible circuit board that has a signal line wiring conductor and a ground line wiring conductor. The signal line wiring is provided on an upper surface of the flexible circuit board, and a ground line wiring conductor is provided on a bottom surface of the flexible circuit board. The signal line wiring conductor and the ground line wiring conductor are opposed to each other. In the flexible circuit board, via hole conductors for electrically connecting the signal line wiring conductor and the ground line wiring conductor are formed at equal pitch intervals in the longitudinal direction.

Japanese Unexamined Patent Application Publication No. 2010-192767 discloses a semiconductor device in which a semiconductor element is mounted on an upper surface of a wiring substrate. In the wiring substrate, an interlayer connection via hole that is connected to a ground is arranged between an interlayer connection via hole, which is connected to a signal terminal in the second column, and an interlayer connection via hole, which is connected to a signal terminal in the fourth column. The interlayer connection via hole connected to the ground serves as a shield to suppress crosstalk between signals.

SUMMARY

A package for an optical module includes a side wall, and a substrate provided through the side wall in a first direction. The substrate includes a first wiring layer that is externally exposed, the first wiring layer including a first signal terminal extending along the first direction, a second signal terminal extending along the first direction, and a first ground terminal extending along the first direction, and being provided between the first signal terminal and the second signal terminal when viewed in a second direction perpendicular to the first direction. The package includes a second wiring layer disposed under the first wiring layer, the second wiring layer including a first ground pattern extending in both the first direction and the second direction. The second wiring layer includes a first insulating layer disposed between the first wiring layer and the second wiring layer, and includes a groove extending along the first direction, the groove being filled with a metal. The groove is provided within the first ground terminal, in a plan view. The first insulating layer is free of the groove. The first ground terminal is electrically coupled to the first ground pattern through the metal of the groove.

DETAILED DESCRIPTION

Details of Embodiments of Present Disclosure

Figure 1:
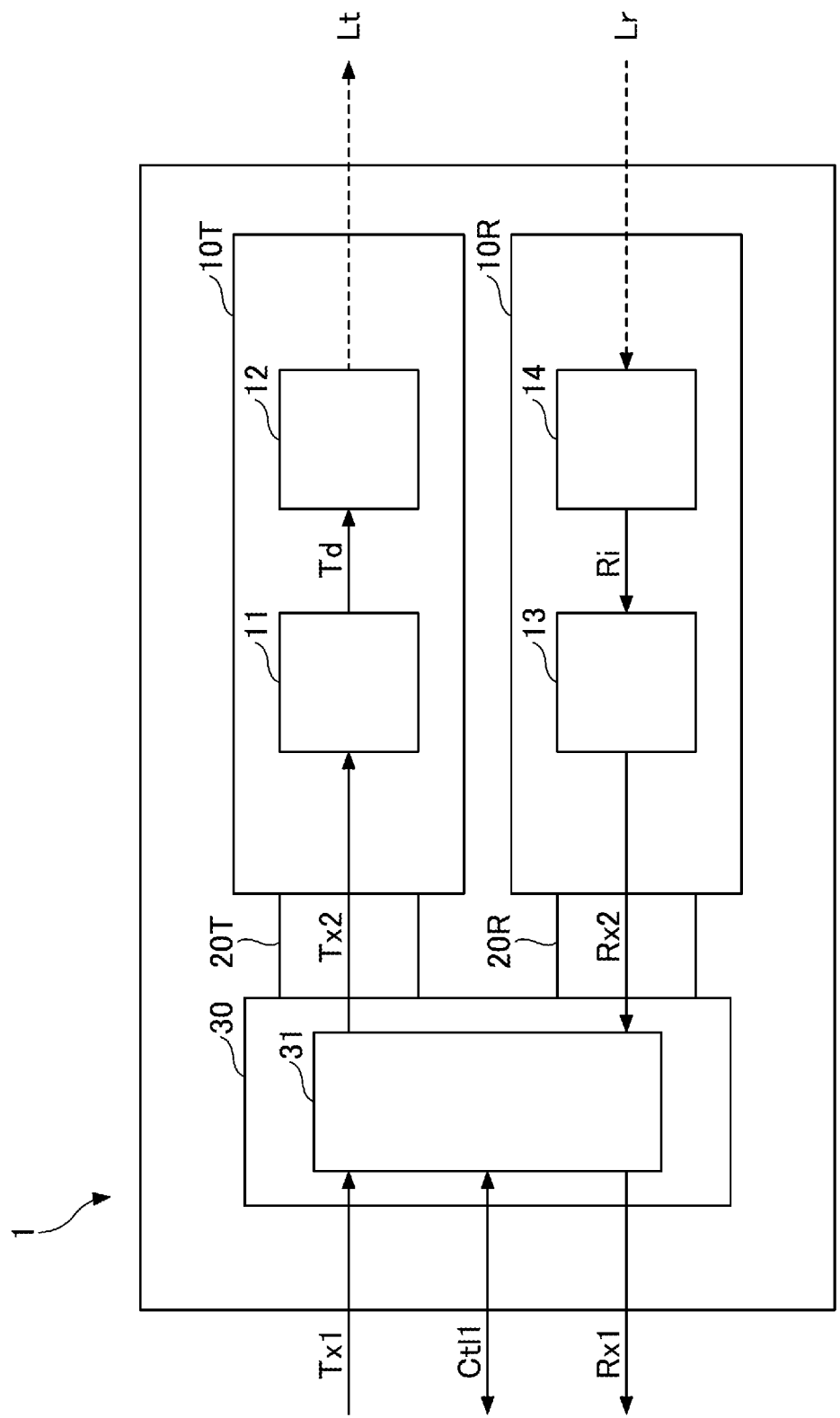
FIG. 1 schematically illustrates a configuration of an optical transceiver according to an embodiment of the present disclosure.

Specific examples of an optical module of the present disclosure will be described below with reference to the drawings. The present invention is not limited to these examples, but is defined by the scope of claims and is intended to include all modifications within the meaning and scope equivalent to the scope of claims.

In the specification and the drawings of each embodiment, configuration elements having substantially the same or corresponding functions are denoted by the same reference numerals, and redundant description thereof may be omitted. For ease of understanding, the scale of each part in the drawings may be different from the actual scale.

In directions such as parallel, perpendicular, orthogonal, horizontal, and vertical directions, deviations are allowed to such an extent that the effects of the embodiment are not impaired. The shape of the corner portion is not limited to a right angle and may be rounded in an arcuate shape. Parallel, perpendicular, orthogonal, horizontal, and vertical may include substantially parallel, substantially perpendicular, substantially orthogonal, substantially horizontal, and substantially vertical. For example, "substantially parallel" means that even if two lines or two surfaces are not completely parallel to each other, they can be treated as being parallel to each other within an allowable range in manufacturing. As in a case of the "substantially parallel," the other substantially right angle, substantially orthogonal, substantially horizontal, and substantially vertical are intended to apply to each of them as long as a mutual positional relationship between two lines or two surfaces is within a range allowed in manufacturing.

An optical transceiver 1 according to an embodiment of the present disclosure will be described. FIG. 1 schematically illustrates a configuration of the optical transceiver 1 according to an embodiment of the present disclosure.

The optical transceiver 1 includes optical modules 10T and 10R, flexible printed boards 20T and 20R, and a circuit board 30. The optical modules 10T and 10R are examples of optical modules 10 according to an embodiment of the present disclosure.

(Optical Module)

The optical modules 10T and 10R mutually convert electrical signals and optical signals. The optical module 10T is, for example, a transmitter optical subassembly (TOSA). The optical module 10R is, for example, a receiver optical subassembly (ROSA).

The optical module 10T includes, for example, a driver 11 and a transmitting optical element 12. The transmitting optical element 12 is, for example, a light emitting element or an optical modulator.

For example, the driver 11 (drive circuit) outputs a drive signal Td for driving the transmitting optical element 12 to the transmitting optical element 12 based on a transmission signal Tx2 from a digital signal processor (DSP) 31 included in the circuit board 30.

The transmitting optical element 12 outputs a transmission optical signal Lt in response to the driving signal Td. The transmission optical signal Lt output from the transmitting optical element 12 is transmitted to another optical transceiver via an optical fiber. The transmitting optical element 12 is, for example, a laser diode or a Mach-Zehnder modulator.

The optical module 10R includes, for example, a transimpedance amplifier 13 and a receiving optical element 14. The transimpedance amplifier 13 converts a received signal Ri, which is a current signal from the receiving optical element 14, into a received signal Rx2, which is a voltage signal, and outputs the received signal Rx2 to the DSP 31 of the circuit board 30.

The receiving optical element 14 is for example a photodiode. The receiving optical element 14 converts a received optical signal Lr received from another optical transceiver via an optical fiber into the received signal Ri.

The optical transceiver 1 may further include a light source 15 (not shown). The light source 15 is, for example, a wavelength tunable laser. The light source 15 generates continuous light (CW light) Lb having a predetermined peak wavelength, and outputs to the transmitting optical element 12. For example, when the transmitting optical element 12 is an optical modulator, the CW light Lb supplied from the light source 15 is modulated according to the drive signal Td to generate the transmission optical signal Lt. The receiving optical element 14 may include a 90° optical hybrid. The receiving optical element 14 may generate the received signal Ri from an optical signal generated by interfering the received optical signal Lr with the CW light Lb.

(Flexible Printed Board)

The flexible printed board 20T electrically connects the optical module 10T and the circuit board to each other. The flexible printed board 20R electrically connects the optical module 10R and the circuit board 30. Each of the flexible printed boards 20T and 20R includes a plurality of signal wirings. The plurality of signal wirings form, for example, a transmission line. For example, each of the flexible printed boards 20T and 20R includes a differential signal wiring including a pair of signal wirings to transmit one differential signal. The differential signal wiring constitutes, for example, a differential transmission line in order to transmit a high-speed differential signal with good waveform quality.

(Circuit Board)

The circuit board 30 includes, for example, a control circuit that controls the inside of the optical transceiver 1. For example, the control circuit includes a detection circuit, a microcontroller, and the like for controlling the operation of the optical modules 10T and 10R. The circuit board 30 performs communication for monitoring and controlling the optical transceiver 1 with a host (transmission device) to which the optical transceiver 1 is connected. Furthermore, the circuit board 30 controls the optical modules 10T and 10R based on, for example, communication with the host. The circuit board 30 transmits information on the operation states of the optical modules 10T and 10R to the host in response to an inquiry from the host.

The circuit board 30 includes, for example, a DSP 31. The DSP 31 converts a transmission signal Tx1 transmitted from the host into a transmission signal Tx2, which is to be transmitted to the driver 11. For example, in a case where the DSP 31 includes a clock data recovery (CDR) circuit, a waveform-shaped signal is generated from the transmission signal Tx1 and is output as the transmission signal Tx2. In addition, the DSP 31 converts the received signal Rx2, which is from the transimpedance amplifier 13, into a received signal Rx1, which is to be transmitted to the host. For example, when the DSP 31 includes a CDR circuit, a waveform-shaped signal is generated from the received signal Rx2 and is output as the received signal Rx1. For example, the DSP 31 transmits and receives a control signal Ctl1 for monitor controlling, to and from the host, respectively, via a dedicated signal wiring that is provided separately from the signal wirings for transmitting the transmission signal Tx1 and the received signal Rx1.

Next, the configuration used in the optical transceiver 1 will be described in detail. In the drawings, an XYZ orthogonal coordinate system may be shown for convenience of description. For example, with respect to a coordinate axis perpendicular to the paper surface of the drawing, when an X mark is shown in a circle of the coordinate axis, it indicates that the direction toward the back with respect to the paper surface is a positive region of the coordinate axis. In addition, regarding a coordinate axis perpendicular to the paper surface of the drawing, when a black circle is shown in a circle of the coordinate axis, this indicates that the front side with respect to the paper surface is a positive region of the coordinate axis. However, the coordinate system mainly indicates directions for the purpose of explanation, and does not limit each of the coordinates and attitude of the optical module or the like of the present disclosure.

Figure 2:
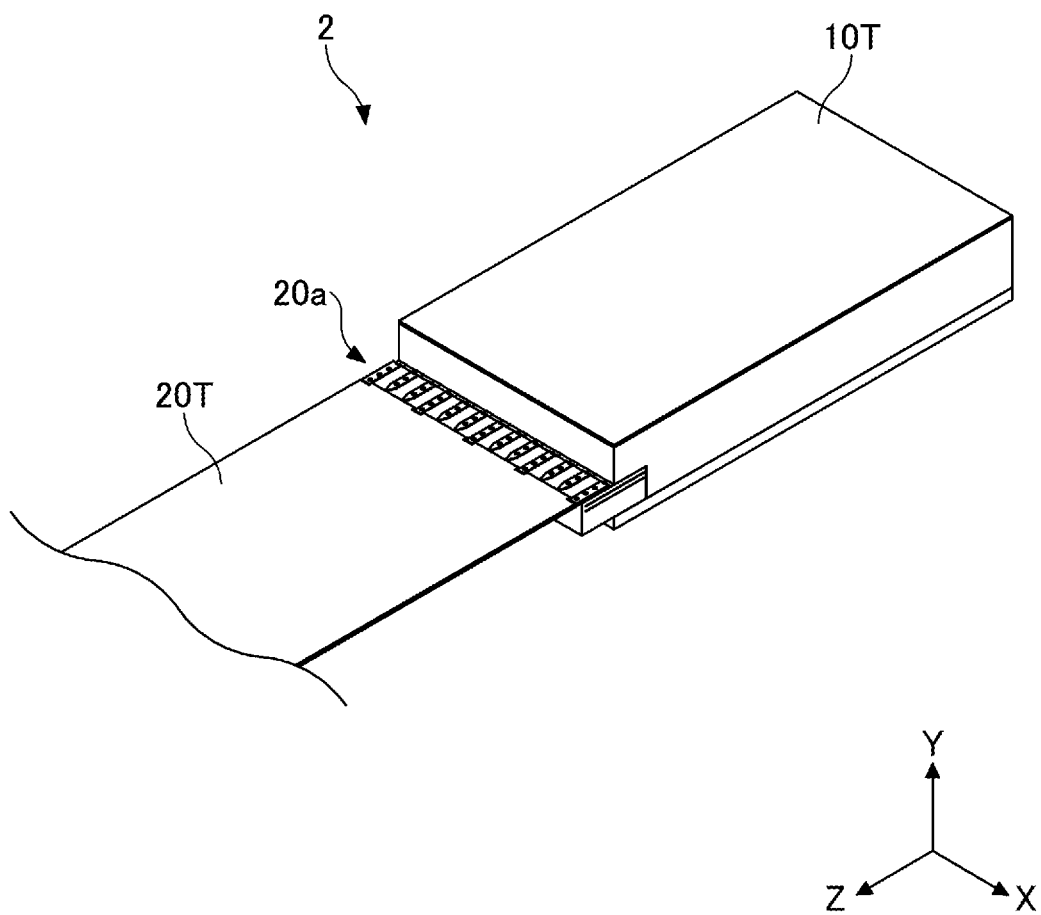
FIG. 2 is a perspective view of an optical module assembly according to an embodiment of the present disclosure.

In the present disclosure, unless otherwise specified, the X-axis is the direction in which the terminals of the optical modules 10T and 10R are aligned, the Y-axis is the thickness direction of the terminals of the optical modules 10T and 10R, and the Z-axis is the direction in which the terminals of the optical modules 10T and 10R extend. For example, the transmission signal Tx2 and the received signal Rx2 are transmitted between the circuit board 30 and the optical modules 10T and 10R along the Z-axis. In addition, unless otherwise specified, coordinate axes having the same name shown in each drawing represent the same thing. For example, the X-axis in FIG. 2 represents the same as the X-axis in FIG. 3.

(Optical Module Assembly)

An optical module assembly 2 includes the optical module 10T and the flexible printed board 20T. Alternatively, the optical module assembly 2 may include the optical module 10R and the flexible printed board 20R. Hereinafter, a case where the optical module assembly 2 is configured by the optical module 10T and the flexible printed board 20T will be described. FIG. 2 is a perspective view of the optical module assembly 2 according to an embodiment of the present disclosure. The optical module 10T and the flexible printed board 20T included in the optical module assembly 2 are electrically connected to each other by soldering or the like.

(Optical Module)

Figure 3:
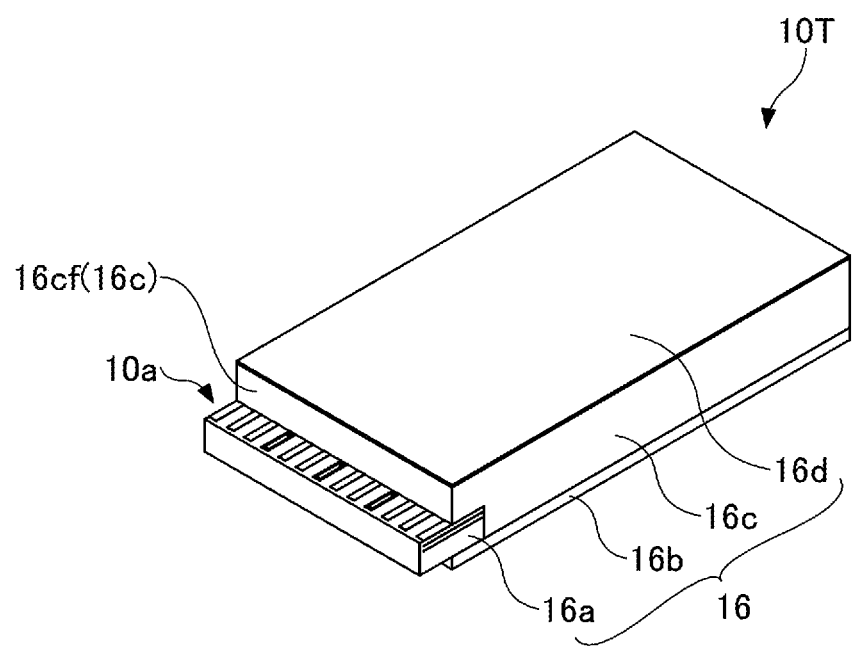
FIG. 3 is a perspective view of an optical module according to an embodiment of the present disclosure.

The optical module 10T includes a package 16 in addition to the driver 11 and the transmitting optical element 12. FIG. 3 is a perspective view of the optical module 10T according to an embodiment of the present disclosure. For example, the driver 11 and the transmitting optical element 12 are housed in the package 16.

The package 16 has, for example, a rectangular parallelepiped outer shape. More specifically, the package 16 includes a substrate 16a, a base plate 16b, a side wall 16c, and a lid 16d.

The substrate 16a introduces, for example, a signal from the outside of the optical module 10T into the optical module 10T. The substrate 16a may output a signal from the inside of the optical module 10T to the outside of the optical module 10T. The substrate 16a has signal wirings for transmitting signals between the inside and the outside of the package 16. Such a signal wiring is also referred to as a feedthrough. The substrate 16a having such signal wirings may be referred to as a feed-through.

The substrate 16a is, for example, a ceramic substrate. The substrate 16a is a multilayer wiring substrate having a wiring layer on the surface and inside thereof. The substrate 16a includes, for example, wiring layers and an insulating layer formed of ceramic between the wiring layers. The optical module 10T has a terminal portion 10a on the substrate 16a. The wiring layer is provided with signal wirings for transmitting the transmission signal Tx2 and the received signal Rx2, a ground line, a power supply line for supplying power to the inside, and the like. The terminal portion 10a is provided in, for example, a wiring layer (first wiring layer) on a surface of the substrate 16a.

The base plate 16b has, for example, a rectangular plate-like outer shape. The base plate 16b has, for example, an upper surface parallel to the XZ plane. For example, the driver 11 and the transmitting optical element 12 are mounted on the upper surface of the base plate 16b. The base plate 16b closes the lower side (−Y side) of the side wall 16c. The base plate 16b is, for example, bonded to the lower side of the side wall 16c or integrally formed with the side wall 16c.

The side wall 16c forms a side wall of the package 16. The side wall 16c includes a pair of side walls (hereinafter referred to as lateral walls) parallel to the YZ plane and a pair of side walls (hereinafter referred to as a front wall and a rear wall) parallel to the XY plane.

A front wall 16cf is provided with the substrate 16a. The rear wall is located opposite to the front wall 16cf in the Z-axis direction. The rear wall is provided with, for example, an optical component (not shown) for outputting the transmission optical signal Lt to the outside. Therefore, for example, the transmission signal Tx2 is input to the front wall 16cf, and the transmission optical signal Lt is output from the rear wall. The front wall 16cf and the rear wall are connected to the pair of lateral walls, respectively. The pair of lateral walls, the front wall 16cf, and the rear wall form a space (internal space) inside the package 16. The internal space is surrounded by the pair of lateral walls, the front wall 16cf, and the rear wall in a plan view of the XZ plane. The driver 11 and the transmitting optical element 12 are accommodated in the internal space. When the circuit board 30 and the optical module 10T are electrically connected to each other via the flexible printed board 20T, the transmission signal Tx2 generated by the circuit board 30 is transmitted to the optical module 10T. A tip of the flexible printed board 20T is connected to the substrate 16a of the optical module 10T, and the transmission signal Tx2 is input to the driver 11 inside the package via the substrate 16a. When the transmission signal Tx2 is configured with four channels, the waveform quality of the transmission optical signal Lt is improved by suppressing crosstalk between the channels (the channels will be described later). Further, since the circuit board 30 and the optical module 10R are electrically connected to each other through the flexible printed board 20R, the received signal Rx2 generated by the optical module 10R in response to the received optical signal Lr is transmitted to the circuit board 30. When the received signal Rx2 is configured with four channels, reception performance of the received optical signal Lr is improved by suppressing crosstalk between the channels.

The lid 16d is connected to an upper side (+Y side) of the side wall 16c. For example, the lid 16d is bonded to the upper side of the side wall 16c. The lid 16d is, for example, a metal lid and is joined to an upper portion of the side wall 16c by seam welding. The internal space is defined by the substrate 16a, the base plate 16b, the side wall 16c, and the lid 16d. For example, the package 16 is hermetically sealed so that a gas (for example, an inert gas) in the internal space is isolated from the outside of the package 16. The optical module 10R has a package similar to the package 16 of the optical module 10T, and accommodates the transimpedance amplifier 13 and the receiving optical element 14 in the internal space of the package. Description of the package of the optical module 10R will be omitted.

(Flexible Printed Board)

Figure 4:
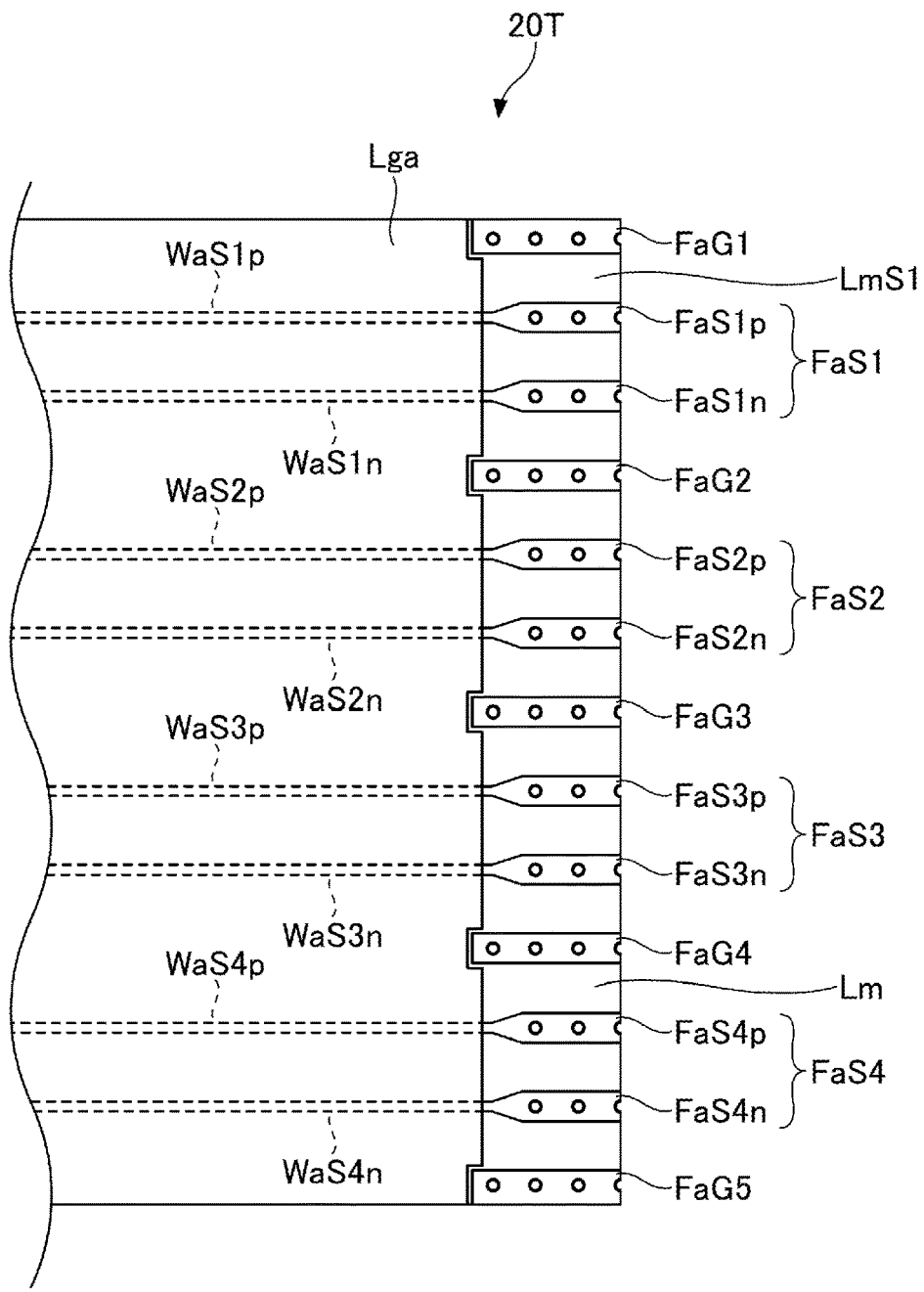
FIG. 4 is a top view of a flexible circuit board according to an embodiment of the present disclosure.
Figure 5:
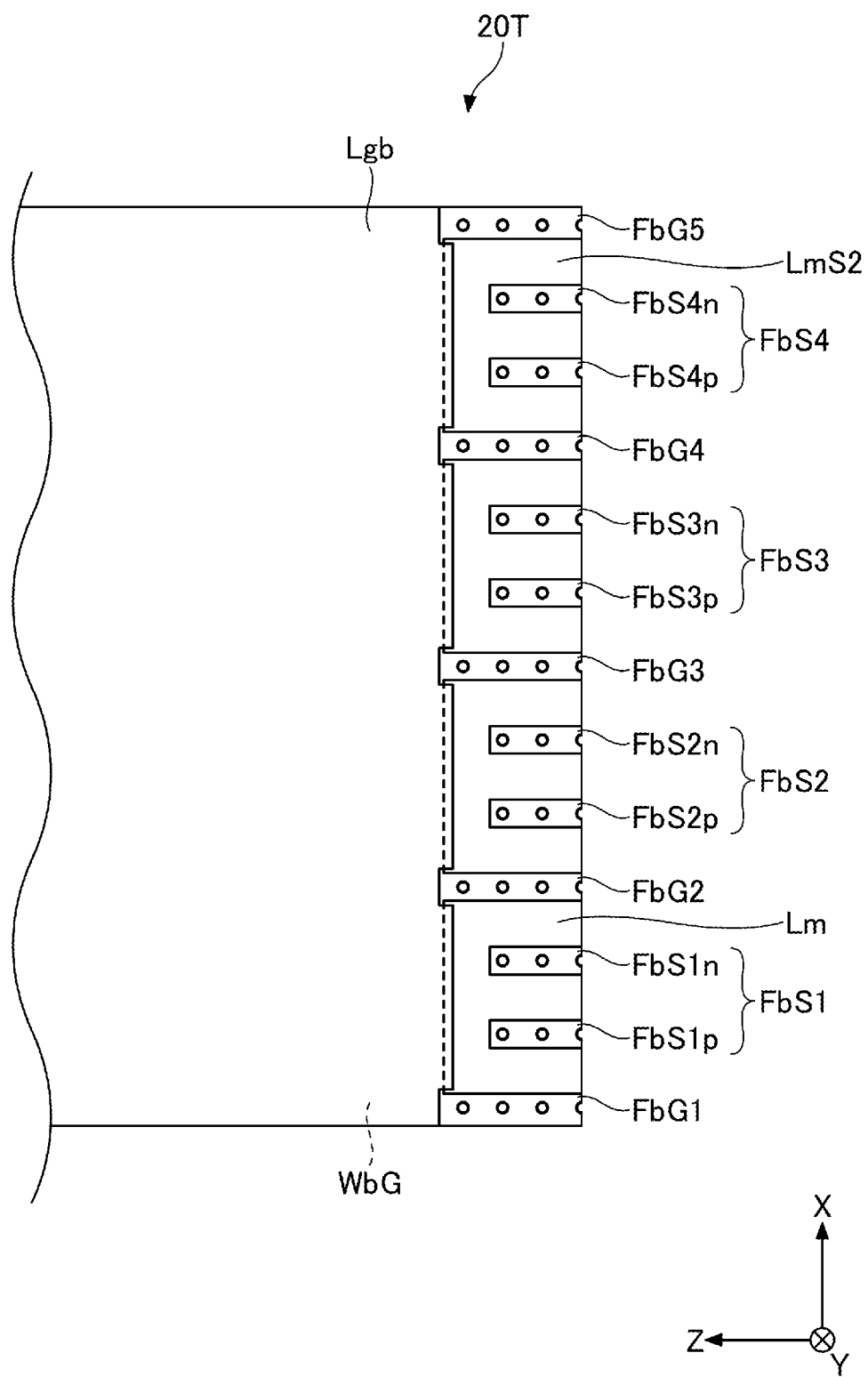
FIG. 5 is a bottom view of a flexible circuit board according to an embodiment of the present disclosure.

The configuration of the flexible printed board 20T will be described in detail. FIG. 4 is a top view of the flexible printed board 20T according to an embodiment of the present disclosure. Specifically, FIG. 4 is a top view of the flexible printed board 20T when viewed from the positive region of the Y-axis toward the negative region of the Y-axis (which may be hereinafter referred to as "in a plan view of the upper surface"). FIG. 5 is a bottom view of the flexible printed board 20T according to an embodiment of the present disclosure. Specifically, FIG. 5 is a top view of the flexible printed board 20T when viewed from the negative region of the Y-axis toward the positive region of the Y-axis (which may be hereinafter referred to as "in a plan view of the lower surface"). The flexible printed board 20R has the configuration similar to that of the flexible printed board 20T. The flexible printed board 20R will not be described in detail.

The flexible printed board 20T extends along the Z-axis direction. For example, the flexible printed board 20T has similar shapes at both ends that are situated in the extending direction (Z-axis direction) of the flexible printed board 20T. Note that the shapes at both ends may differ from each other. In FIGS. 4 and 5, the end portion of the flexible printed board 20T on a side that is connected to the optical module 10T (the negative side of the Z-axis) is shown, and the description of the end portion of the flexible printed board 20T on a side (the positive side of the Z-axis) opposite to the side that is connected to the optical module 10T is omitted.

The flexible printed board 20T has a pair of signal wiring WaS1$p$ and signal wiring WaS1$n$ on an upper surface LmS1 of an insulating layer Lm. The pair of signal wiring WaS1$p$ and signal wiring WaS1$n$ is formed as part of the wiring layer of the upper surface. Each of the signal wiring WaS1$p$ and the signal wiring WaS1$n$ extends along the Z-axis direction. A differential signal (for example, the transmission signal Tx2) is transmitted to the signal wiring WaS1$p$ and the signal wiring WaS1$n$. The signal wiring WaS1$p$ and the signal wiring WaS1$n$ are configured by a material having conductivity. For example, the signal wiring WaS1$p$ and the signal wiring WaS1$n$ are configured by a metal such as copper (Cu). Other signal wirings described below are also formed of a conductive material. For example, when the differential signal includes a positive-phase component (positive-phase signal) and a negative-phase component (negative-phase signal), the positive-phase signal is transmitted by the signal wiring WaS1$p$, and the negative-phase signal is transmitted by the signal wiring WaS1$n$. The signal wiring WaS1$p$ and the signal wiring WaS1$n$ are arranged adjacent to each other along, for example, the X-axis direction. The signal wiring WaS1$p$ and the signal wiring WaS1$n$ are configured as a transmission line, for example.

The flexible printed board 20T has a signal terminal FaS1$p$ connected to the signal wiring WaS1$p$ at an end portion of the upper surface LmS1 of the insulating layer Lm on the side connected to the optical module 10T. The flexible printed board 20T has a signal terminal FaS1$n$ connected to the signal wiring WaS1$n$ at the end portion of the upper surface LmS1 on the side connected to the optical module 10T. The signal terminal FaS1$p$ and the signal terminal FaS1$n$ may be collectively referred to as a differential signal terminal FaS1. The signal terminal FaS1$p$ and the signal terminal FaS1$n$ are configured by a material having conductivity. For example, the signal terminal FaS1$p$ and the signal terminal FaS1$n$ are configured by the same metal as the metal configuring the signal wiring WaS1$p$ and the signal wiring WaS1$n$. The signal terminal FaS1$p$ and the signal terminal FaS1$n$ are arranged adjacent to each other, for example, along the X-axis direction.

Similarly, the flexible printed board 20T has a pair of signal wiring WaS2$p$ and signal wiring WaS2$n$ on the upper surface LmS1 of the insulating layer Lm. The pair of signal wiring WaS2$p$ and signal wiring WaS2$n$ is formed as part of the wiring layer of the upper surface. Each of the signal wiring WaS2$p$ and the signal wiring WaS2$n$ extends along the Z-axis direction. Differential signals different from the differential signals transmitted by the signal wiring WaS1$p$ and the signal wiring WaS1$n$ are transmitted in the signal wiring WaS2$p$ and the signal wiring WaS2$n$. The signal wiring WaS2$p$ and the signal wiring WaS2$n$ are formed as, for example, a transmission line. The flexible printed board 20T has a signal terminal FaS2$p$ connected to the signal wiring WaS2$p$, and has a signal terminal FaS2$n$ connected to the signal wiring WaS2$n$. The signal terminal FaS2P and the signal terminal FaS2$n$ are at an end portion of the upper surface LmS1 on the side that is connected to the optical module 10T. The signal terminal FaS2$p$ and the signal terminal FaS2$n$ may be collectively referred to as a differential signal terminal FaS2.

Further, the flexible printed board 20T includes a pair of signal wiring WaS3$p$ and signal wiring WaS3$n$, and includes a pair of signal wiring WaS4$p$ and signal wiring WaS4$n$. These pairs are on the upper surface LmS1. The pair of signal wiring WaS3$p$ and signal wiring WaS3$n$ has the configuration similar to that of the pair of signal wiring WaS1$p$ and signal wiring WaS1$n$. The pair of signal wiring WaS4$p$ and signal wiring WaS4$n$ has the configuration similar to that of the pair of signal wiring WaS1$p$ and signal wiring WaS1$n$. The pair of signal wiring WaS3$p$ and signal wiring WaS3$n$ and the pair of signal wiring WaS4$p$ and signal wiring WaS4$n$ will not be described in detail.

Further, the flexible printed board 20T includes a signal terminal FaS3$p$ connected to the signal wiring WaS3$p$, a signal terminal FaS3$n$ connected to the signal wiring WaS3$n$, a signal terminal FaS4$p$ connected to the signal wiring WaS4$p$, and a signal terminal FaS4$n$ connected to the signal wiring WaS4$n$. Detailed description of the signal terminal FaS3$p$, the signal terminal FaS3$n$, the signal terminal FaS4$p$, and the signal terminal FaS4$n$ will be omitted.

The signal wiring WaS1$p$, signal wiring WaS1$n$, signal wiring WaS2$p$, signal wiring WaS2$n$, signal wiring WaS3$p$, signal wiring WaS3$n$, signal wiring WaS4$p$, and signal wiring WaS4$n$ are arranged on the upper surface LmS1 in order from the negative side of the X-axis, when viewed in the X-axis direction. The flexible printed board 20T has an insulating coating Lga on the upper surface LmS1 so as to cover the signal wiring WaS1$p$, the signal wiring WaS1$n$, and other signal wirings. The insulating coating Lga is formed of a material having an insulating property, and prevents, for example, each signal wiring from electrically contacting another wiring or the like and prevents the signal wiring from being damaged due to contact with the outside. The insulating coating Lga may be, for example, a coverlay or a solder resist.

The flexible printed board 20T has a ground pattern FaG1 at the end portion on the negative side of the X-axis at the end on the side connected to the optical module 10T. The ground pattern FaG1 is configured by a material having conductivity. For example, the ground pattern FaG1 is configured by a metal such as Cu. When the optical module 10T is mounted in the optical transceiver 1, the ground pattern FaG1 is electrically connected to the ground wiring of the optical transceiver 1. Note that other ground patterns described below are configured in the manner similar to the ground pattern FaG1. In addition, the flexible printed board 20T has a ground pattern FaG2 between the signal terminal FaS1$n$ and the signal terminal FaS2$p$, in other words, between the differential signal terminal FaS1 and the differential signal terminal FaS2. Similarly, the flexible printed board 20T has a ground pattern FaG3 between the signal terminal FaS2$n$ and the signal terminal FaS3$p$, in other words, between the differential signal terminal FaS2 and the differential signal terminal FaS3. In addition, the flexible printed board 20T has a ground pattern FaG4 between the signal terminal FaS3$n$ and the signal terminal FaS4$p$, in other words, between the differential signal terminal FaS3 and the differential signal terminal FaS4. A ground pattern FaG5 is provided at the end portion on the positive side of the X-axis at the end portion on the side connected to the optical module 10T.

The flexible printed board 20T has a ground pattern WbG on a lower surface LmS2 of the insulating layer Lm. The ground pattern WbG is a planar pattern that extends in the XZ-plane parallel to both the X-axis direction and the Z-axis direction. The ground pattern WbG is formed as a so-called solid pattern, for example. The ground pattern WbG is formed as a part of the wiring layer of the lower surface LmS2. In addition, the flexible printed board 20T has a ground terminal FbG1, a ground terminal FbG2, a ground terminal FbG3, a ground terminal FbG4, and a ground terminal FbG5 in order from the negative side of the X-axis along the X-axis direction at the end portion of the lower surface LmS2 of the insulating layer Lm on the side connected to the optical module 10T. Each of the ground terminal FbG1, ground terminal FbG2, ground terminal FbG3, ground terminal FbG4, and ground terminal FbG5 extends along the Z-axis direction and is connected to the ground pattern WbG. A configuration including the ground terminal FbG1, the signal terminal FbS1$p$, the signal terminal FbS1$n$, and the ground terminal FbG2 arranged along the X-axis direction is also referred to as a GSSG configuration. Here, S denotes a signal wiring (signal terminal) and G denotes a ground wiring (ground terminal).

The ground pattern FaG1 is electrically connected to the ground terminal FbG1 via a through hole via (hereinafter, simply referred to as a via hole). The circles shown in FIGS. 4 and 5 represent via holes. The via hole passes through the insulating layer Lm along the Y-axis direction, and is internally plated to electrically connect the wiring layer of the upper surface LmS1 and the wiring layer of the lower surface LmS2. Note that the via hole may be filled with a metal. Similarly, the ground pattern FaG2 is electrically connected to the ground terminal FbG2 through a via hole. Similarly, the ground pattern FaG3, the ground pattern FaG4, and the ground pattern FaG5 are electrically connected to the ground terminal FbG3, the ground terminal FbG4, and the ground terminal FbG5, respectively, through the via holes.

The flexible printed board 20T includes the signal terminal FbS1$p$ and the signal terminal FbS1$n$ between the ground terminal FbG1 and the ground terminal FbG2. The signal terminal FbS1$p$ is electrically connected to the signal terminal FaS1$p$ through a via hole. The signal terminal FbS1$n$ is electrically connected to the signal terminal FaS1$n$ through a via hole.

Similarly, the flexible printed board 20T has a signal terminal FbS2$p$ and a signal terminal FbS2$n$ between the ground terminal FbG2 and the ground terminal FbG3. The signal terminal FbS2$p$ is electrically connected to the signal terminal FaS2$p$ through a via hole. The signal terminal FbS2$n$ is electrically connected to the signal terminal FaS2$n$ through a via hole.

In addition, the flexible printed board 20T includes a signal terminal FbS3$p$ and a signal terminal FbS3$n$ between the ground terminal FbG3 and the ground terminal FbG4. The signal terminal FbS3$p$ is electrically connected to the signal terminal FaS3$p$ through a via hole. The signal terminal FbS3$n$ is electrically connected to the signal terminal FaS3$n$ through a via hole.

Further, the flexible printed board 20T includes a signal terminal FbS4$p$ and a signal terminal FbS4$n$ between the ground terminal FbG4 and the ground terminal FbG5. The signal terminal FbS4$p$ is electrically connected to the signal terminal FaS4$p$ through a via hole. The signal terminal FbS4$n$ is electrically connected to the signal terminal FaS4$n$ through a via hole.

The flexible printed board 20T has an insulating coating Lgb on the lower surface LmS2 so as to cover the ground pattern WbG. The insulating coating Lgb is formed of a material having an insulating property and prevents, for example, the ground pattern from electrically contacting another wiring or the like or the ground pattern from being damaged due to contact with the outside. The insulating coating Lgb may be, for example, a coverlay or a solder resist. Note that the insulating coating Lgb may cover portions other than portions where the wiring layer needs to be exposed, such as the signal terminal FbS1$p$ and the signal terminal FbS1$n$.

In the flexible printed board 20T, the signal wiring WaS1$p$, the signal wiring WaS1$n$, and the ground pattern WbG configure a transmission line. Similarly, the signal wiring WaS2$p$ and signal wiring WaS2$n$, the signal wiring WaS3$p$ and signal wiring WaS3$n$, the signal wiring WaS4$p$ and signal wiring WaS4$n$, and the ground pattern WbG constitute transmission lines. The transmission lines are configured as differential transmission lines, which are particularly suitable for transmitting differential signals. The transmission line may be, for example, a microstrip line or a grounded coplanar line.

The plurality of ground terminals and the plurality of signal terminals formed on the lower surface LmS2 of the flexible printed board 20T are connected to the ground terminals and the plurality of signal terminals formed on the terminal portion 10$a$ of the optical module 10T by soldering. At this time, the ground terminal of the flexible printed board 20T is connected to the ground terminal of the optical module 10T in one-to-one correspondence, and the plurality of signal terminals of the flexible printed board 20T are connected to the plurality of signal terminals of the optical module 10T corresponding thereto in one-to-one correspondence.

When the flexible printed board 20T and the optical module 10T are connected to each other, in order to reduce signal reflection at the connection portion, the flexible printed board 20T and the optical module 10T are preferably connected to each other such that impedance is matched at the connection portion. Note that the plurality of ground terminals and the plurality of signal terminals formed on the upper surface LmS1 of the flexible printed board 20T may be connected to the corresponding ground terminals and the plurality of signal terminals formed on the terminal portion 10$a$ of the optical module 10T by soldering in a state where the flexible printed board 20T is turned upside down (the upper surface LmS1 and the lower surface LmS2 are replaced with each other). When the flexible printed board 20T is turned upside down, the order of the differential signal terminals FaS1, FaS2, FaS3, and FaS4 in the X-axis direction is opposite to that before turning upside down, but the order of the differential signals may be appropriately changed so that the plurality of signal terminals of the flexible printed board 20T and the plurality of signal terminals of the optical module 10T correctly correspond to each other.

<Details of Substrate 16$a$>

Figure 6:
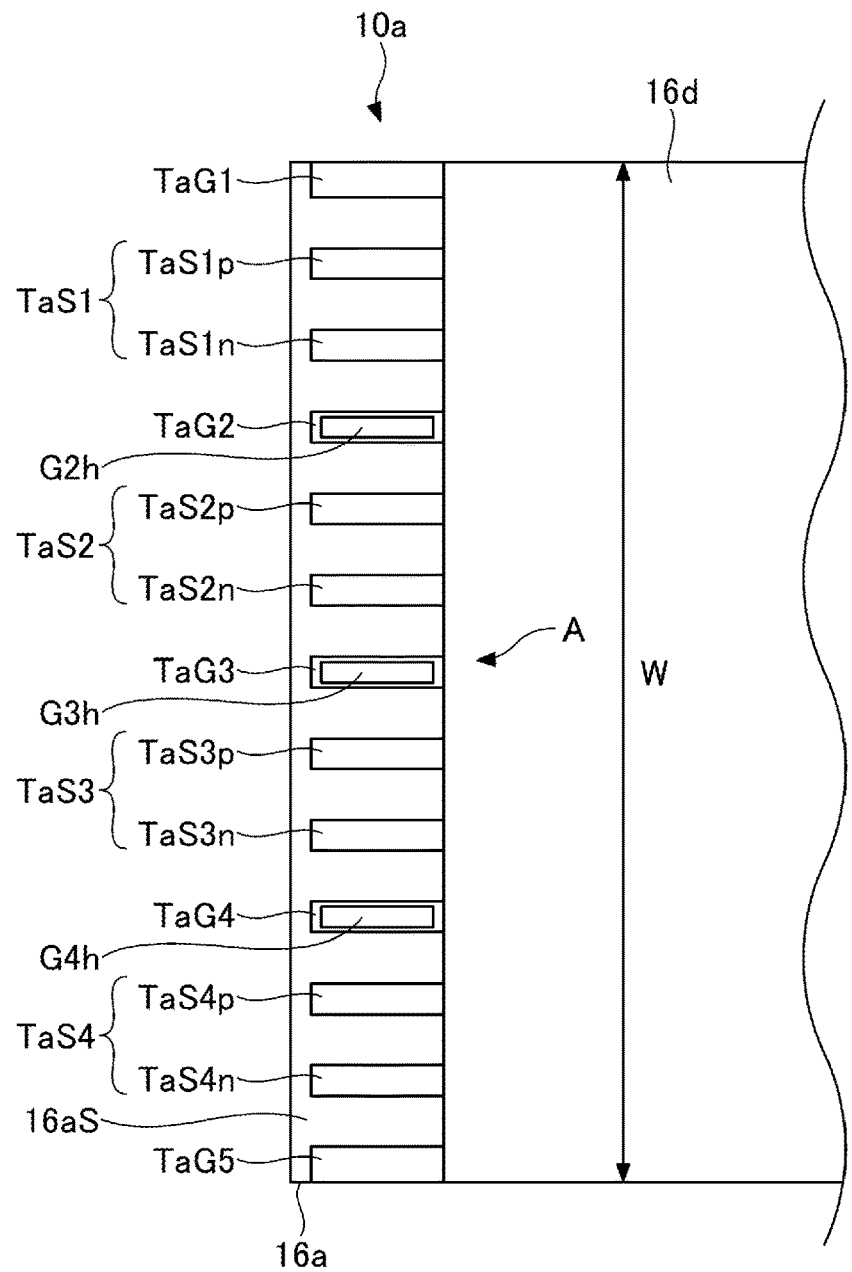
FIG. 6 is a top view of a terminal portion of an optical module according to an embodiment of the present disclosure.

The substrate 16$a$ configuring the terminal portion 10$a$ of the optical module 10T will be described in detail. FIG. 6 is a top view of the terminal portion 10$a$ of the optical module 10T according to an embodiment of the present disclosure. Specifically, FIG. 6 is a top view when the optical module 10T is viewed from the positive region of the Y-axis toward the negative region of the Y-axis (or in a plan view of the substrate 16$a$).

The optical module 10T includes a ground terminal TaG1, a signal terminal TaS1$p$, a signal terminal TaS1$n$, and a ground terminal TaG2 in the terminal portion 10$a$, more specifically, on an upper surface 16$a$5 of the substrate 16$a$, in order from the end on the negative side of the X-axis toward the positive side of the X-axis. The ground terminal TaG1, the signal terminal TaS1$p$, the signal terminal TaS1$n$, and the ground terminal TaG2 are formed as part of the wiring layer of the upper surface 16$a$S. The wiring layer is configured by a material having conductivity. For example, the wiring layer is constituted by a metal such as tungsten (W). Each of the signal terminal TaS1$p$ and the signal terminal TaS1$n$ extends along the Z-axis direction. The signal terminal TaS1$p$ and the signal terminal TaS1$n$ may be collectively referred to as a differential signal terminal TaS1.

The configuration formed by the ground terminal TaG1, the signal terminal TaS1p, the signal terminal TaS1n, and the ground terminal TaG2 arranged along the X-axis direction is an example of the GSSG configuration.

In addition, the optical module 10T includes a signal terminal TaS2p, a signal terminal TaS2n, and a ground terminal TaG3 adjacent to the ground terminal TaG2 in this order toward the positive side of the X-axis on the upper surface 16aS. Each of the signal terminal TaS2p and the signal terminal TaS2n extends along the Z-axis direction. The signal terminal TaS2p and the signal terminal TaS2n may be collectively referred to as a differential signal terminal TaS2. For example, when the differential signal includes a positive-phase component (positive-phase signal) and a negative-phase component (negative-phase signal), the positive-phase signal is input to the signal terminal TaS2p, and the negative-phase signal is input to the signal terminal TaS2n. The configuration formed by the ground terminal TaG2, the signal terminal TaS2p, the signal terminal TaS2n, and the ground terminal TaG3 arranged along the X-axis direction is an example of the GSSG configuration. As described above, this GSSG configuration and the above-described GSSG configuration may be configured to share a ground terminal (G) at an end. Therefore, for example, it may be configured to be written as GSSGSSG.

Further, the optical module 10T has, on the upper surface 16aS, a signal terminal TaS3p, a signal terminal TaS3n, and a ground terminal TaG4 adjacent to the ground terminal TaG3 in this order toward the positive side of the X-axis. Each of the signal terminal TaS3p and the signal terminal TaS3n extends along the Z-axis direction. The signal terminal TaS3p and the signal terminal TaS3n may be collectively referred to as a differential signal terminal TaS3. The configuration of the ground terminal TaG3, the signal terminal TaS3p, the signal terminal TaS3n, and the ground terminal TaG4 arranged along the X-axis direction is an example of the GSSG configuration. The configuration of the ground terminal TaG3, the signal terminal TaS3p, the signal terminal TaS3n, and the ground terminal TaG4 arranged along the X-axis direction may have the same shape, interval, or the like as the configuration of the ground terminal TaG2, the signal terminal TaS2p, the signal terminal TaS2n, and the ground terminal TaG3.

Furthermore, the optical module 10T has, on the upper surface 16aS, a signal terminal TaS4p, a signal terminal TaS4n, and a ground terminal TaG5 adjacent to the ground terminal TaG4 in this order toward the positive side of the X-axis. Each of the signal terminal TaS4p and the signal terminal TaS4n extends along the Z-axis direction. The signal terminal TaS4p and the signal terminal TaS4n may be collectively referred to as a differential signal terminal TaS4. The configuration of the ground terminal TaG4, the signal terminal TaS4p, the signal terminal TaS4n, and the ground terminal TaG5 arranged along the X-axis direction is an example of the GSSG configuration.

Each of the ground terminal TaG1, the ground terminal TaG2, the ground terminal TaG3, the ground terminal TaG4 and the ground terminal TaG5 extends along the Z-axis direction on the upper surface 16aS. Note that the length (width) in the X-axis direction, the interval (pitch) in the X-axis direction, and the length in the Z-axis direction of each ground terminal may be set to the same value. For example, the interval of the ground terminal TaG1 and the ground terminal TaG2 may be set to the same value as the interval of the ground terminal TaG2 and the ground terminal TaG3. Each of the ground terminal TaG1, the ground terminal TaG2, the ground terminal TaG3, the ground terminal TaG4, and the ground terminal TaG5 is electrically connected to the ground wiring inside the package 16.

The substrate 16a includes a groove G2h having a bottom surface configured by a ground pattern TcG of a second wiring layer L2, which will be described below, and disposed inside the ground terminal TaG2 in a plan view in the Y-axis direction. Similarly, the substrate 16a includes a groove G3h having a bottom surface configured by the ground pattern TcG inside the ground terminal TaG3. In addition, the substrate 16a includes a groove G4h having a bottom surface configured by the ground pattern TcG inside the ground terminal TaG4.

Figure 7:
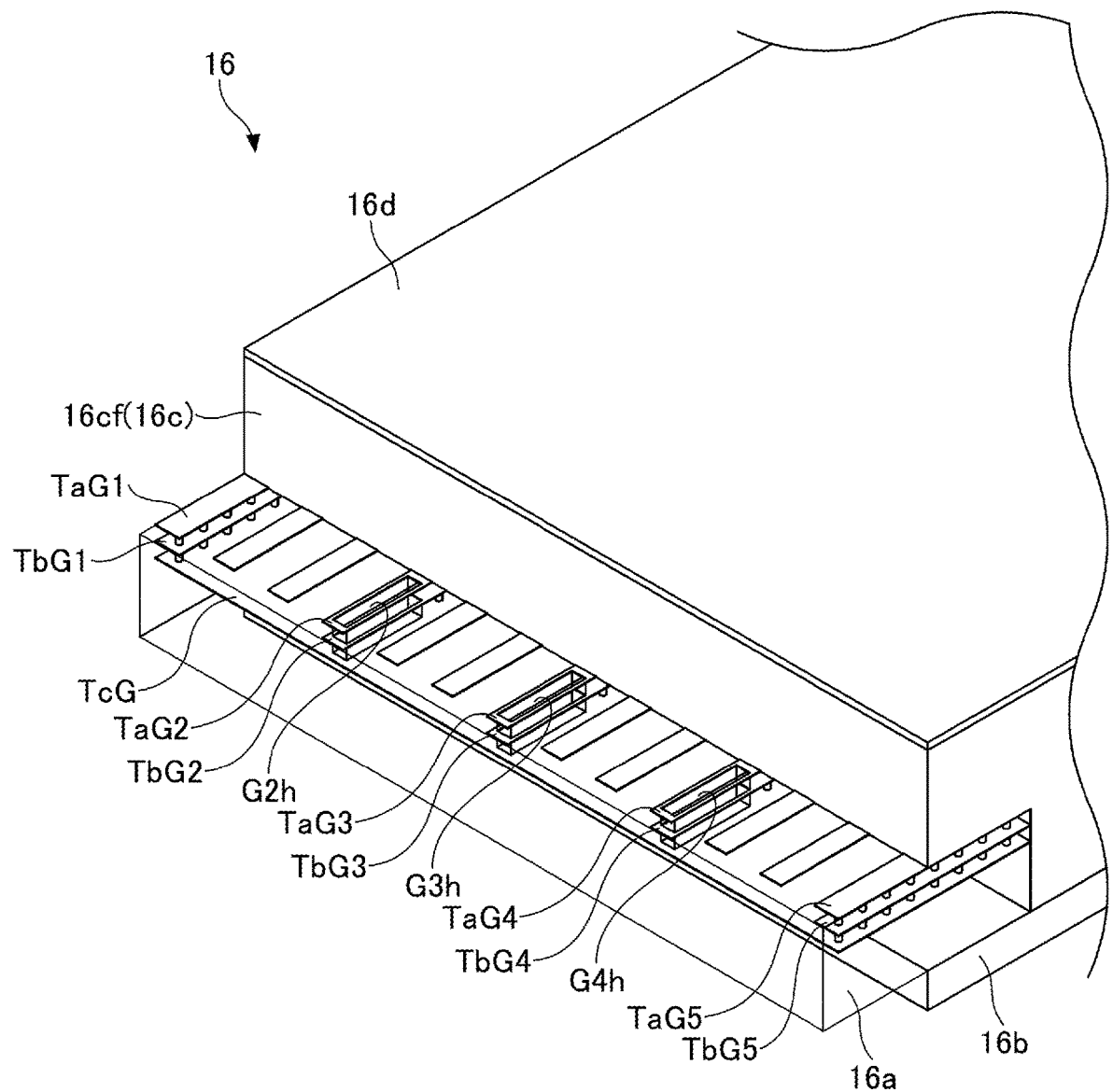
FIG. 7 is a perspective view of a substrate of an optical module according to an embodiment of the present disclosure.
Figure 8:
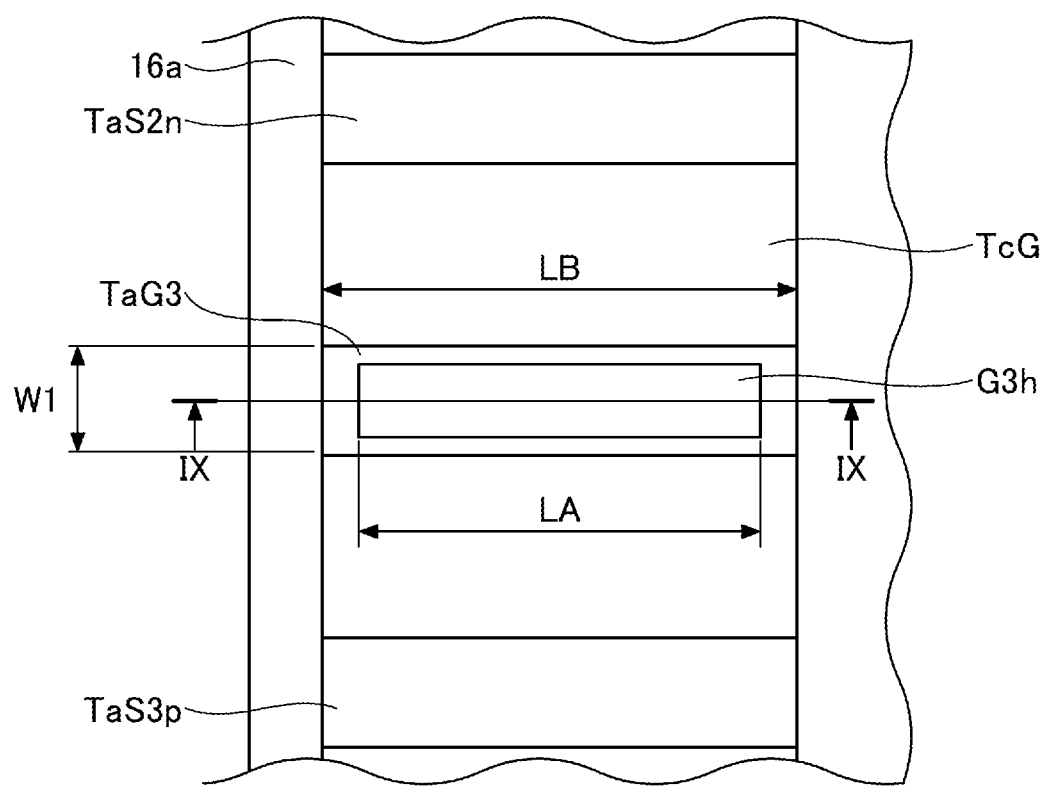
FIG. 8 illustrates a terminal portion of an optical module according to an embodiment of the present disclosure.
Figure 8:
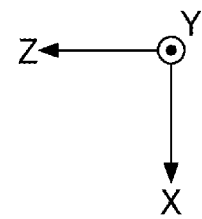

FIG. 7 is a perspective view of the substrate 16a of the optical module 10T according to an embodiment of the present disclosure. In FIG. 7, the insulating layer of the substrate 16a is transparent and the wiring layer and the via hole are drawn with solid lines. FIG. 8 is an enlarged top view of region A of FIG. 6 for the terminal portion 10a of the optical module 10T according to an embodiment of the present disclosure. Specifically, FIG. 8 is a top view when the terminal portion of the optical module 10T is viewed from the positive region of the Y-axis toward the negative region of the Y-axis.

Figure 9:
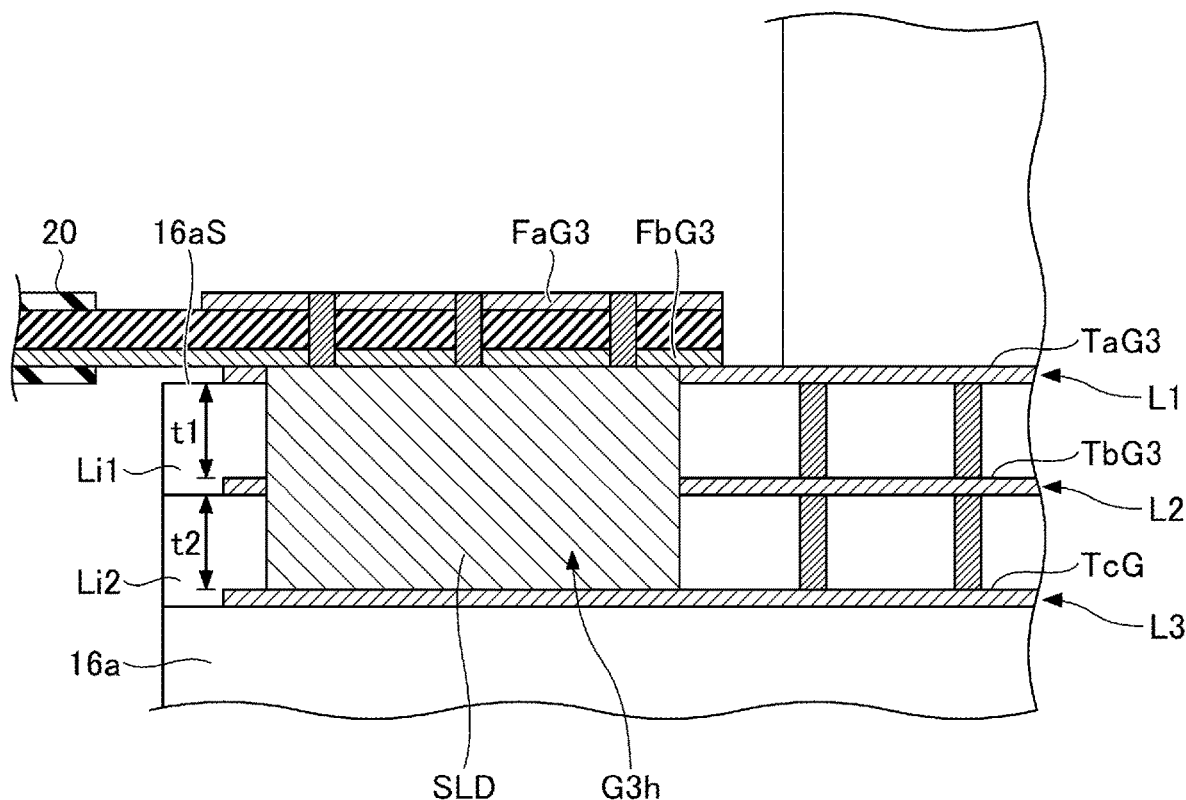
FIG. 9 illustrates a terminal portion of an optical module according to an embodiment of the present disclosure.
Figure 9:
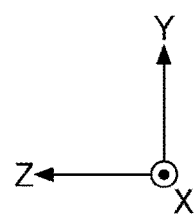

FIG. 9 is a cross-sectional view taken along the IX-IX line of FIG. 8. In detail, the terminal portion 10a of the optical module 10T is cut along the IX-IX line of FIG. 8 and viewed from the positive region of the X-axis toward the negative region of the X-axis. FIG. 9 is a diagram showing a state in which the flexible printed board 20T is connected to the terminal portion 10a of the optical module 10T.

In the state shown in FIG. 9, the ground terminal FbG1, the ground terminal FbG2, the ground terminal FbG3, the ground terminal FbG4, and the ground terminal FbG5 of the flexible printed board 20T are connected to the ground terminal TaG1, the ground terminal TaG2, the ground terminal TaG3, the ground terminal TaG4, and the ground terminal TaG5 of the terminal portion 10a, respectively. In addition, the differential signal terminal FbS1, the differential signal terminal FbS2, the differential signal terminal FbS3, and the differential signal terminal FbS4 of the flexible printed board 20T are also connected to the differential signal terminal TaS1, the differential signal terminal TaS2, the differential signal terminal TaS3, and the differential signal terminal TaS4, respectively. The connection between the ground terminals and the connection between the signal terminals are performed by soldering, for example.

The substrate 16a includes a first wiring layer (outer wiring layer) L1 provided on the upper surface 16aS of the substrate 16a, a second wiring layer (supporting wiring layer) L2 formed between the first wiring layer L1 and the third wiring layer L3, a first insulating layer Li1 sandwiched between the first wiring layer L1 and the second wiring layer L2, a third wiring layer (inner wiring layer) L3 formed under the first wiring layer L1, and a second insulating layer Li2 sandwiched between the second wiring layer L2 and the third wiring layer L3. That is, the third wiring layer L3, the second insulating layer Li2, the second wiring layer L2, the first insulating layer Li1, and the first wiring layer L1 are stacked in this order along the Y-axis direction from the negative region of the Y-axis to the positive region of the Y-axis. The first wiring layer L1, the second wiring layer L2, and the third wiring layer L3 are formed parallel to the XZ plane. The first wiring layer L1, the second wiring layer L2, and the third wiring layer L3 are formed of a conductive metal (for example, tungsten). The first wiring layer L1 is the uppermost layer of the substrate 16a having a stacked structure, the second wiring layer L2 is formed between the first wiring layer L1 and the third wiring layer, and the third wiring layer L3 is formed below the second wiring layer L2. The second wiring layer L2 (supporting wiring layer) is dispensable. When the second wiring layer L2 is omitted, the first insulating layer Li1 and the second insulating layer Li2 may be unified (merged) as a first insulating layer Li1.

(First Wiring Layer)

The substrate 16a has the ground terminal TaG1, the ground terminal TaG2, the ground terminal TaG3, the ground terminal TaG4, and the ground terminal TaG5 as ground terminals in the first wiring layer L1. In addition, the substrate 16a has the signal terminal TaS1p, the signal terminal TaS1n, the signal terminal TaS2p, the signal terminal TaS2n, the signal terminal TaS3p, the signal terminal TaS3n, the signal terminal TaS4p, and the signal terminal TaS4n as signal terminals in the first wiring layer L1. The signal terminal TaS1p and the signal terminal TaS1n are used to transmit one differential signal. FIG. 6 shows an exemplary embodiment in which four differential signals S1, S2, S3, and S4 are transmitted in parallel with one another. One differential signal or one differential signal wiring is also referred to as a channel. That is, FIG. 6 illustrates an example embodiment in which four channels are handled. When only one channel is handled, the first wiring layer L1 may include at least the ground terminal TaG1, the signal terminal TaS1p, the signal terminal TaS1n, and the ground terminal TaG2. In this case, the ground terminal TaG1, the signal terminal TaS1p, the signal terminal TaS1n, and the ground terminal TaG2 may be configured to have the above-described GSSG configuration. When two channels are handled, the first wiring layer L1 may include at least the ground terminal TaG1, the signal terminal TaS1p, the signal terminal TaS1n, the ground terminal TaG2, the signal terminal TaS2p, the signal terminal TaS2n, and the ground terminal TaG3. In this case, the ground terminal TaG1, the signal terminal TaS1p, the signal terminal TaS1n, the ground terminal TaG2, the signal terminal TaS2p, the signal terminal TaS2n, and the ground terminal TaG3 may be configured to have the above-described GSSGSSG configuration.

Each of the ground terminal and the signal terminal is formed of a conductive member. Each of the ground terminal and the signal terminal extends along the Z-axis direction. The ground terminal has a lateral width W1 (see FIG. 8) in the X-axis direction. The ground terminal TaG2 has an opening in the groove G2h. Similarly, the ground terminal TaG3 has an opening in the groove G3h. The ground terminal TaG4 has an opening in the groove G4h. The lateral width of the signal terminal, the distance between the pair of signal terminals, and the distance between the signal terminal and the ground terminal are determined such that a differential transmission line is formed according to the thickness of the insulating layer in the Y-axis direction, the dielectric constant of the insulating layer, and the like. On the other hand, for size reduction or high-density mounting of the optical module 10T, the length of the terminal portion 10a in the X-axis direction (for example, equal to a lateral width W of the optical module 10T) is preferably a small value (see FIG. 6). Therefore, it is preferable that the lateral width W1 of the ground terminal, the lateral width of the signal terminal, the distance between the pair of signal terminals, and the distance between the signal terminal and the ground terminal have small values.

(First Insulating Layer)

The substrate 16a has the first insulating layer Li1 between the first wiring layer L1 and the second wiring layer L2. The first insulating layer Li1 is for example shaped as a green sheet containing a ceramic material and is formed by sintering. The first insulating layer Li1 is formed of an insulating material and electrically insulates the first wiring layer L1 and the second wiring layer L2 from each other. A thickness t1 of the first insulating layer Li1 is, for example, between 100 and 300 micrometers. The substrate 16a is provided with a via hole penetrating the first insulating layer Li1 in order to electrically connect a wiring or a terminal provided in the first wiring layer L1 to a wiring provided in the second wiring layer L2. The via hole will be described later.

(Second Wiring Layer)

The substrate 16a has a ground pattern TbG1, under the ground terminal TaG1 of the first wiring layer L1, in the second wiring layer L2. Similarly, the substrate 16a has a ground pattern TbG2 under the ground terminal TaG2, a ground pattern TbG3 under the ground terminal TaG3, a ground pattern TbG4 under the ground terminal TaG4, and a ground pattern TbG5 under the ground terminal TaG5. The ground pattern TbG2 has a hole for forming a groove G2h. Similarly, the ground pattern TbG3 has a hole for forming a groove G3h. The ground pattern TbG4 has a hole for forming a groove G4h.

In the second wiring layer L2, a conductive member such as an electrode is not provided below each of the signal terminal TaS1p, the signal terminal TaS1n, the signal terminal TaS2p, the signal terminal TaS2n, the signal terminal TaS3p, the signal terminal TaS3n, the signal terminal TaS4p, and the signal terminal TaS4n. In the region where there is no conductive member such as an electrode, the first insulating layer and the second insulating layer are formed in contact with each other. In the region where there is no conductive member such as an electrode, the first insulating layer Li1 and the second insulating layer Li2 may be integrated with each other.

(Second Insulating Layer)

The substrate 16a has the second insulating layer Li2 between the second wiring layer L2 and the third wiring layer L3. The second insulating layer Li2 is for example shaped as a green sheet containing a ceramic material and is formed by sintering. The second insulating layer Li2 is formed of a material having insulating properties and electrically insulates the second wiring layer L2 and the third wiring layer L3 from each other. A thickness t2 of the second insulating layer Li2 is for example between 100 and 300 micrometers. The second insulating layer Li2 is provided with a via hole for electrically connecting the wiring provided in the second wiring layer L2 and the wiring provided in the third wiring layer L3.

(Third Wiring Layer)

The substrate 16a has the ground pattern TcG provided in the third wiring layer L3 over the X-axis direction from below the ground terminal TaG1 to below the ground terminal TaG5. Thus, the ground pattern TcG extends along the Z-axis direction and the X-axis direction, or extends in the XZ plane parallel to both the X direction and the Z direction. The ground pattern TcG may be a so-called solid pattern (solid ground). In a plan view from the Y-axis direction, the ground terminals TaG1, TaG2, TaG3, TaG4, and TaG5 are positioned inside the ground pattern TbG3. The ground pattern TcG configures a bottom surface of each of the groove G2h, the groove G3h, and the groove G4h.

Note that the first insulating layer Li1 and the second insulating layer Li2 may be collectively referred to as insulating layers. That is, the substrate 16a includes an insulating layer between the third wiring layer (inner wiring layer) L3 and the first wiring layer (outer wiring layer) L1.

The substrate 16a also includes an insulating layer below the third wiring layer L3, i.e., between the third wiring layer L3 and the lower surface of the substrate 16a. Accordingly, the third wiring layer L3 is interposed between the insulating layers along the Y-axis direction.

(Groove)

The groove will now be described in more detail with reference to the relevant figures. Since the groove G2h, the groove G3h, and the groove G4h have the same configuration, the groove G3h of the ground terminal TaG3 will be described as an example with reference to FIGS. 8 and 9.

The ground terminal TaG3 is disposed between the signal terminal TaS2n and the signal terminal TaS3p when viewed from a direction (Y-axis direction) perpendicular to the substrate 16a (i.e., in a plan view of the substrate 16a). The ground terminal TaG3 is provided between the differential signal terminal TaS2 and the differential signal terminal TaS3 (see FIG. 6). The groove G3h is provided inside the ground terminal TaG3 in a plan view of the substrate 16a. The groove G3h is provided as a hole passing through the first insulating layer Li1, the second wiring layer L2, and the second insulating layer Li2 from the first wiring layer L1 to the third wiring layer L3 along the Y-axis direction. Therefore, in the groove G3h, the first insulating layer Li1, the second wiring layer L2, and the second insulating layer Li2 are excluded. The groove G3h is formed by, for example, punching a green sheet layer corresponding to each of the first insulating layer Li1 and the second insulating layer Li2 into a predetermined shape using a punch die in the manufacturing process of the substrate 16a. As shown in FIG. 9, a metal (for example, solder) SLD is filled in the groove G3h. The ground terminal TaG3 is electrically coupled to the solder SLD. The ground terminal TaG3 is electrically connected to the ground pattern TbG3 and the ground pattern TcG by the solder SLD. When the ground terminal TaG3 of the terminal portion 10a is electrically connected to the ground terminal FbG3 of the flexible printed board 20T, the potential of the solder SLD becomes the ground potential. Therefore, the groove G3h acts as a shield for blocking electromagnetic influence of the signal terminal TaS2n and the signal terminal TaS3p from each other. Since the solder SLD is filled in the groove G3h and there is no space in which an electromagnetic field leaks along the X-axis direction, the solder SLD has a sufficient blocking effect with respect to a high-speed signal. Preferably, a length LA of the groove G3h in the Z-axis direction is close to a length LB of the ground terminal TaG3 in the Z-axis direction. For example, since the ground terminal TaG3 is bonded to the ground terminal FbG3 of the flexible printed board 20T by soldering, it is preferable that the area of the bonding portion other than the groove G3h of the ground terminal TaG3 is large. Accordingly, the length LA of the groove G3h in the Z-axis direction may be less than the length LB of the ground terminal TaG3 in the Z-axis direction. For example, the length LA may be not less than 70% and not more than 90% of the length LB. However, when the solder SLD filled in the groove G3h is bonded to the ground terminal of the flexible printed board 20T, the length LA of the groove G3h in the Z-axis direction may be the same as the length LB of the ground terminal TaG3 in the Z-axis direction.

According to the package 16 of the optical module 10T of the embodiment, in two signal terminals provided with a ground terminal interposed therebetween, it is possible to prevent an electromagnetic field generated in one signal terminal from leaking from a portion of the ground terminal and being transmitted to the other signal terminal. In other words, the optical module according to the embodiment can suppress crosstalk between adjacent signal terminals. By filling the inside of the groove with solder and setting the solder in the groove to the ground potential, a shield against an electromagnetic field is formed between the two signal terminals, and an electromagnetic field generated in one signal terminal is more reliably blocked so as not to spread to the other signal terminal.

Figure 11A:
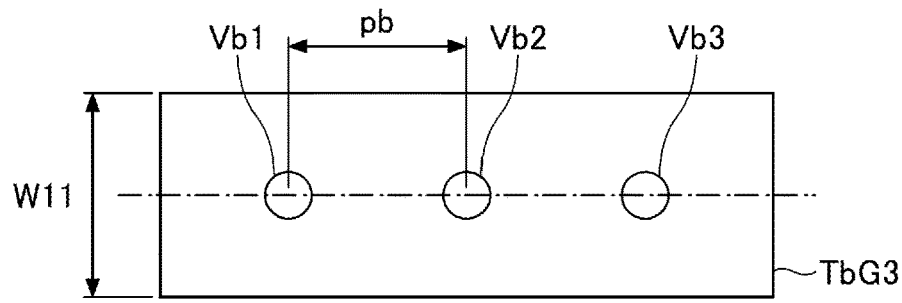
FIG. 11A is a top view of a ground pattern of a comparative example.
Figure 11A:
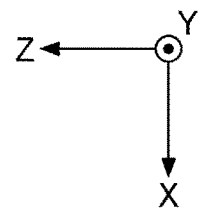

For example, as one of the comparative examples, a via hole extending in the Y-axis direction may be provided to electrically connect the ground terminal TaG3 to the ground pattern TbG3 and the ground pattern TcG. For example, as shown in FIG. 11A, when the ground pattern TbG3 is provided with via holes Vb1, Vb2, and Vb3 for connection with the ground pattern TcG, the ground pattern TbG3 has a lateral width W11 in the X-axis direction with a straight line passing through the centers of the via holes Vb1, Vb2, and Vb3 as a centerline. The lateral width W11 is set to, for example, a value (minimum value) determined by restrictions on manufacturing of the package. The via holes Vb1, Vb2 and Vb3 are arranged along the Z-axis direction at a constant interval pb. The interval pb is set to, for example, a value (minimum value) determined by restrictions on package manufacturing. The effect of reducing crosstalk between the signal terminal TaS2n and the signal terminal TaS3p adjacent to each other by the via holes Vb1, Vb2, and Vb3 provided as described above can also be expected when the speed of signals is relatively low. However, when the signal speed is increased, an electromagnetic field due to high-frequency components (for example, 30 GHz or higher) leaks between the via holes and is not sufficiently blocked, and crosstalk may occur.

Figure 11B:
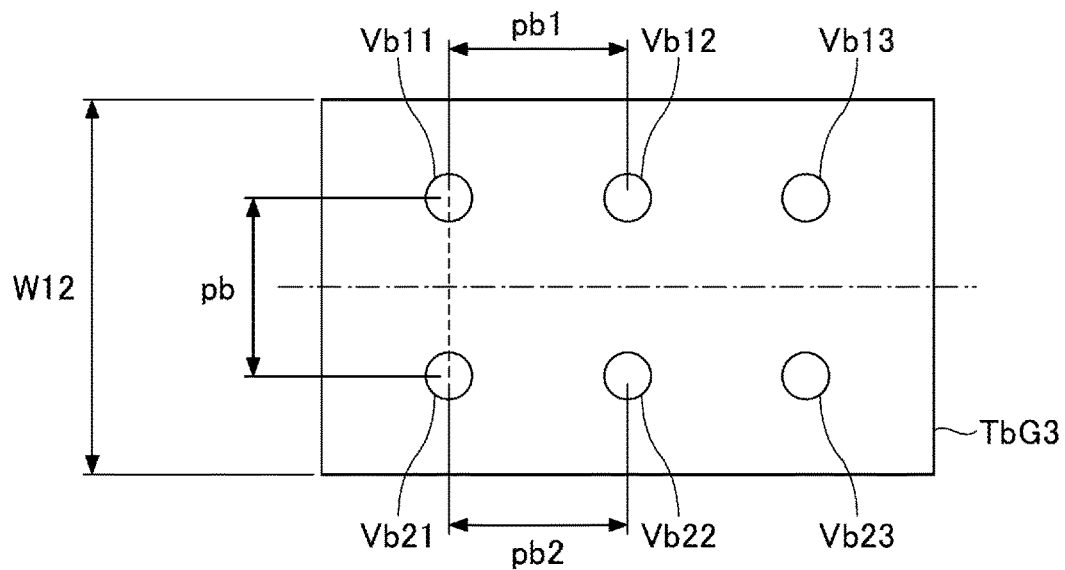
FIG. 11B is a top view of a ground pattern of a comparative example.
Figure 11B:
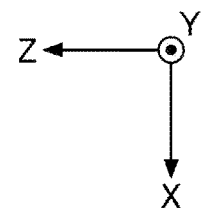

For such a high-speed signal, as a modification of the comparative example, as shown in FIG. 11B, via holes Vb11, Vb12, and Vb13 arranged in a line along the Z-axis direction at a constant interval pb1 and via holes Vb21, Vb22, and Vb23 arranged in a line along the Z-axis direction at a constant interval pb2 may be arranged side by side along the X-axis direction. At this time, the via hole Vb11 and the via hole Vb21 are disposed at the same position in the Z-axis direction. The via holes Vb12 and Vb22 and the via holes Vb13 and Vb23 are also arranged at the same positions in the same manner. The interval pb between the row of the via holes Vb11, Vb12, and Vb13 and the row of the via holes Vb2l, Vb22, and Vb23 is set to, for example, a value (minimum value) determined by constraints on package manufacturing. In this case, the ground pattern TbG3 has a lateral width W12 in the X-axis direction. The lateral width W12 is expressed as W12≥W11+pb with respect to the lateral width W11 of the comparative example. In the modification of the comparative example, since the number of via holes in the X-axis direction is doubled, it can be expected that the effect of reducing the crosstalk is relatively improved as compared with the comparative example. However, it is still impossible to sufficiently cut off high-frequency components (for example, 30 GHz or higher).

Meanwhile, in the optical module 10T according to the embodiment of the present disclosure, the lateral width W1 (see FIG. 8) of the ground pattern Tb3G provided with the groove G3h is larger than the lateral width W11 of the comparative example but can be smaller than the lateral width W12 of the modification. The lateral width W1 is preferably small in order to reduce the length of the terminal portion 10a in the X-axis direction (corresponding to the lateral width W in FIG. 6) and thus reduce the size of the optical module 10T. As described above, since the solder filled in the groove G3h forms a shield without a clearance through which an electromagnetic field leaks along the X-axis direction, it is possible to sufficiently block high frequency components (for example, 30 GHz or higher). Therefore, the optical module 10T according to the embodiment of the present disclosure can more reliably reduce crosstalk between adjacent signal terminals while suppressing an increase in the lateral width W1.

The Z-axis direction is an example of a first direction, and the X-axis direction is an example of a second direction that intersects the first direction. For example, when the ground terminal TaG3 is exemplified as the first ground terminal, the signal terminal TaS2n is an example of the first signal terminal, and the signal terminal TaS3p is an example of the second signal terminal. Further, the ground pattern TcG is an example of the ground pattern.

<Modification 1>

Figure 10:
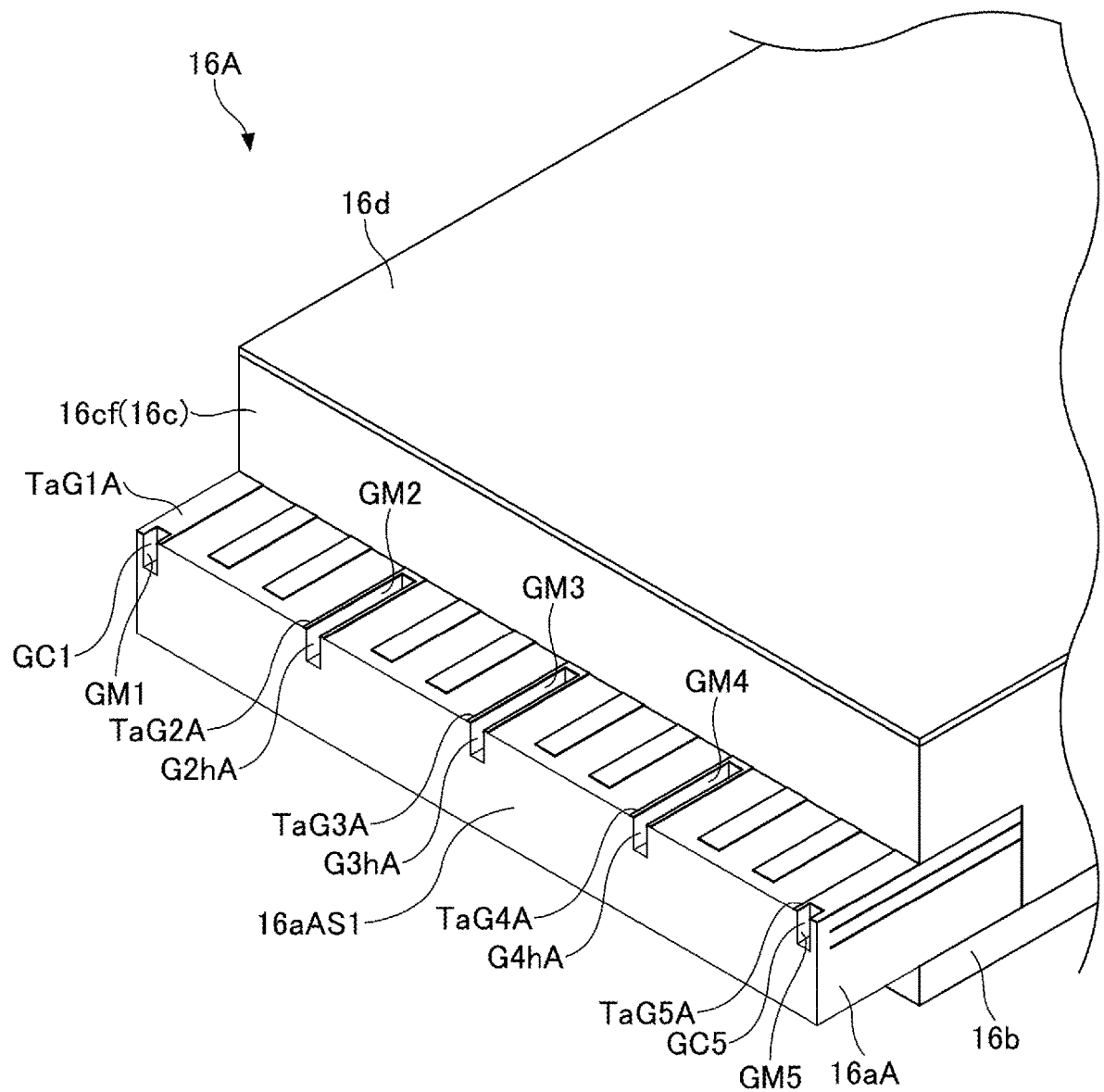
FIG. 10 is a perspective view of a modification of an optical module according to an embodiment of the present disclosure.
Figure 10:
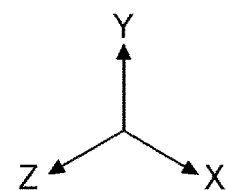

FIG. 10 is a diagram showing a package 16A which is a modification of the package 16 of the optical module 10T according to an embodiment of the present disclosure. The package 16A is different from the package 16 in that it includes a substrate 16aA instead of the substrate 16a included in the package 16.

The substrate 16aA has an end surface 16aAS1 perpendicular to the Z-axis direction. The package 16A has the substrate 16aA, and the substrate 16aA has ground terminals TaG1A, TaG2A, TaG3A, TaG4A, and TaG5A. The ground terminals TaG1A, TaG2A, TaG3A, TaG4A, and TaG5A are provided to extend to the end surface 16aAS1. In the ground terminal TaG2A, a groove G2hA is provided to extend to the end surface 16aAS1 inside the ground terminal TaG2A in the plan view from the Y-axis direction. Therefore, a length of the groove G2hA in the Z-axis direction is closer to a length of the ground terminal TaG2A in the Z-axis direction than the length LA of the groove G3h in the Z-axis direction shown in FIG. 8. On a side surface of the groove G2hA parallel to the YZ plane, a metal layer GM2 is formed of a conductive metal material. Similarly, in the ground terminal TaG3A, a groove G3hA is provided so as to extend to the end surface 16aAS1 inside the ground terminal TaG3A in the plan view from the Y-axis direction. On a side surface of the groove G3hA parallel to the YZ plane, a metal layer GM3 is formed of a conductive metal material. In addition, in the ground terminal TaG4A, a groove G4hA is provided to extend to the end surface 16aAS1 inside the ground terminal TaG4A in the plan view from the Y-axis direction. On a side surface of the groove G4hA parallel to the YZ plane, a metal layer GM4 is formed of a conductive metal material.

By forming each of the groove G2hA, the groove G3hA, and the groove G4hA to the end face 16aAS1 along the Z-axis direction, it is possible to more reliably suppress leakage of an electromagnetic field from the signal terminal along the X-axis direction. Further, since each side surface of the groove G2hA, groove G3hA, and groove G4hA are metallized, the solder wettability is improved, and when the flexible printed board is connected to the terminal portion, the flow of the solder into the groove is promoted, so that the groove can be reliably filled with the solder.

The substrate 16aA has a groove GC1 that also opens to the end surface 16aAS1 in the ground terminal TaG1A. A side surface parallel to the YZ plane of the groove GC1 has a metal layer GM1. Similarly, the substrate 16aA has a groove GC5 that is also open to the end surface 16aAS1 in the ground terminal TaG5A. A side surface parallel to the YZ plane of the groove GC5 has a metal layer GM5.

The metal layer may be provided on the side surfaces of the groove G2h, the groove G3h, and the groove G4h of the substrate 16a.

<Modification 2>

Although the optical module 10 according to the embodiment of the present disclosure has been described using the optical module 10T as an example of the TOSA, the optical module 10 is not limited to the TOSA. For example, the optical module 10 may be the optical module 10R as an example of a receiver optical sub-assembly (ROSA). Further, for example, the optical module 10 may be an optical module in which a light source, an optical modulator, and an optical receiver are accommodated in one package. That is, the package 16 can be applied as various packages for optical modules that input and output a plurality of high-speed signals.

In the optical module 10 according to the embodiment of the present disclosure, the signal transmitted by the signal terminal is described as a differential signal, but the signal transmitted by the signal terminal may be a single-ended signal.

What is claimed is:

1. A package for an optical module comprising:
    a side wall; and
    a substrate provided through the side wall in a first direction, the substrate including
        a first wiring layer that is externally exposed, the first wiring layer including
            a first signal terminal extending along the first direction,
            a second signal terminal extending along the first direction, and
            a first ground terminal extending along the first direction, and being provided between the first signal terminal and the second signal terminal when viewed in a second direction perpendicular to the first direction,
        a second wiring layer disposed under the first wiring layer, the second wiring layer including
            a first ground pattern extending in both the first direction and the second direction, and
        a first insulating layer disposed between the first wiring layer and the second wiring layer, and
        a groove extending along the first direction, the groove being filled with a metal,
    wherein the groove is provided within the first ground terminal, in a plan view,
    wherein the first insulating layer is free of the groove, and
    wherein the first ground terminal is electrically coupled to the first ground pattern through the metal of the groove.

2. The package according to claim 1, wherein the substrate includes an end surface perpendicular to the first direction, and
    wherein in the plan view, the groove extends to the end surface.

3. The package according to claim 1, wherein the groove defines a side surface that extends in both the first direction and a third direction, the third direction being perpendicular to the first direction and the second direction, and
    wherein the side surface is metalized.

4. An optical module comprising:
    the package according to claim 1; and
    an optical semiconductor device included in the package.

5. A flexible printed board configured to be coupled to the package of the optical module according to claim 4.

6. An optical module assembly comprising:
    the optical module according to claim 4; and
    a flexible printed board coupled to the optical module.

* * * * *